United States Patent

Shanks et al.

[11] Patent Number: 5,821,688
[45] Date of Patent: Oct. 13, 1998

[54] FLEXIBLE PANEL DISPLAY HAVING THIN FILM TRANSISTORS DRIVING POLYMER LIGHT-EMITTING DIODES

[75] Inventors: Howard R. Shanks; Stanley G. Burns; Frank R. Jeffrey, III, all of Ames, Iowa

[73] Assignee: Iowa State University Research Foundation, Ames, Iowa

[21] Appl. No.: 970,684

[22] Filed: Nov. 14, 1997

Related U.S. Application Data

[62] Division of Ser. No. 320,029, Oct. 7, 1994, Pat. No. 5,747,928.

[51] Int. Cl.$^6$ .......................... H05B 33/02; H01L 29/04
[52] U.S. Cl. .......................... 313/498; 313/499; 313/504; 313/506; 313/509; 345/76; 257/59; 257/72; 257/347
[58] Field of Search .................... 313/498, 499, 313/504, 506, 509, 500, 501, 502, 505, 512; 345/76; 257/59, 72, 347

[56] References Cited

U.S. PATENT DOCUMENTS

| | | | |
|---|---|---|---|
| 4,707,692 | 11/1987 | Hifggins et al. | 345/76 X |
| 4,864,182 | 9/1989 | Fujioka et al. | 345/76 X |
| 5,041,884 | 8/1991 | Kumamoto et al. | 257/347 |
| 5,084,905 | 1/1992 | Sasaki et al. | 257/347 |
| 5,200,668 | 4/1993 | Ohashi et al. | 313/499 X |
| 5,235,189 | 8/1993 | Hayden et al. | 257/347 |
| 5,274,602 | 12/1993 | Glenn | 365/239 |
| 5,276,380 | 1/1994 | Tang | 345/76 X |
| 5,334,539 | 8/1994 | Shinar et al. | 345/76 X |

OTHER PUBLICATIONS

"The Origin of Slow Rates States At the Interface of alpha–Si:H and Silicon Nitride", by R.A. Streets et al., Mat. Res. Soc. Symp. Proc. vol. 70, pp. 367–372, Dec. 1986.
"Properties of The Interface between Amorphous Silicon and Nitride", by Tsai et al., Mat. Res. Soc. Symp. Proc. vol. 70, pp. 351–359, Dec. 1986.
"Defect States In Silicon Nitride", by Robertson et al., Mat. Res. Soc. Symp. Proc. vol. 49, pp. 215–222, Dec. 1985.

*Primary Examiner*—Ashok Patel
*Attorney, Agent, or Firm*—Leydig, Voit & Mayer, Ltd.

[57] ABSTRACT

A non-planar electronic light-emitting display has a display area divided into a matrix of pixels. Each pixel includes two primary elements, an electronic driver and a light-emitting diode based on a light-emitting polymer. The electronic driver is a thin film transistor device of amorphous silicon formed on the insulating substrate. The diode has a first electrode connected to and driven by the electronic transistor, a layer of light-emitting polymer deposited on the electrode, and an overlying electrode normally biased on. Energization of the driver biases the diode to cause the polymer to emit light. Each pixel is configured with the two-component structure described above, and row and column lines to the matrix of pixels are decoded by the drivers to cause selective illumination of the pixels.

9 Claims, 2 Drawing Sheets

FLEXIBLE PANEL DISPLAY HAVING THIN FILM TRANSISTORS DRIVING POLYMER LIGHT-EMITTING DIODES

This is a divisional of application Ser. No. 08/320,029, filed on Oct. 7, 1994 now U.S. Pat. No. 5,747,928.

FIELD OF THE INVENTION

This invention relates to electronic displays, and more particularly to such displays which need not be planar—i.e., those which are readily formed into a curved shape, or those which are flexible.

BACKGROUND OF THE INVENTION

Display technology, in which the display is treated as a pixelized space, and the pixels are selectively illuminated to display a variety of shapes and characters, are reasonably well developed. CRT displays are an early example. More currently, particularly in portable computers, liquid crystal displays, and active matrix liquid crystal displays, are popular. Each of those types of displays has its own requirements for decoding, driving and the like, and those can be quite different. However, the basic technology of processing electronic signals for display, and translating the display into drive signals for a pixelized display, has been well researched and developed.

While there are a number of different types of displays (for example, the CRT and liquid crystal types mentioned above), the displays themselves are not without their shortcomings. The requirement for portability argues against the use of CRT's. Liquid crystal and active matrix liquid crystal displays have satisfied the bulk of portable requirements, but such displays are quite expensive. Viewing of the displays either requires peripheral illumination or a light source in the display for reflection by the liquid crystal elements. Most conventionally, liquid crystal displays are in the form of flat panel displays of rather limited dimension.

The possibility of meeting the requirements of flexible displays (such as credit card-sized electronic devices) or curved displays such as might be needed for virtual reality displays, is not readily met by flat panel liquid crystal technology. Nor are CRT's with their dimensional limitations and high voltage requirements particularly suitable for such applications.

SUMMARY OF THE INVENTION

With the technology thus limited, it is a general aim of the present invention to provide an electronic display which is readily configured in a curved or flexible (hereinafter non-planar) configuration, and is thus suitable for applications not readily served by the current flat panel liquid crystal displays.

Thus, it is an object of the invention to provide an electronic display which is not necessarily limited to the use of flat glass substrates.

A further object of the invention is to provide an electronic display which includes associated driver electronics so as to limit the number of interconnections to associated driving circuitry. Thus, it is an object according to a particular aspect of the invention to associate with a pixelized display a driver transistor with each of the pixels, and to positionally associate the driver transistor with the display elements which produce the illumination.

According to a further aspect of the invention, it is an object to provide an electronic display in the form of a large matrix of individual pixels, in which the elements of the pixels actually serve to emit (rather than simply reflect) light.

According to a further aspect of the invention, it is an object to provide decoding and driving circuitry in each pixel intimately associated with an electronically responsive light-emitting polymer-based device, so that each pixel of the display includes decoding elements, driving elements, and light-emitting elements, whereby receipt of appropriate row and column signals in the pixel will serve to perform the necessary electronic operations to cause that pixel to emit (or not emit) light.

According to a more detailed aspect of the invention, it is an object to provide the technology for producing electronic displays which need not be planar, the technology including the deposition of both the driving electronics and light-emitting electronically responsive elements on a non-planar substrate to produce an integrated display technology.

It is a feature of the present invention that light-emitting polymers are utilized to generate light in each of the pixels for display, and each pixel also includes a thin film transistor driving circuit directly connected to an electrode of the light-emitting polymer, so that each pixel has both the driving and light-emitting capability necessary to selectively provide illumination for that pixel.

It is a further feature of the invention that the display technology is not restricted by a substrate planarity requirement, in that the substrate can be curved or flexible, and the semiconductor drivers and electronically responsive light-emitting elements readily deposited on such a curved or flexible substrate.

It is a feature of the invention that displays not readily provided by liquid crystal technology are easily configured, including flexible credit card-like displays, curved virtual reality displays, or visor-like displays useful, for example, in pilot interface applications.

Other objects and advantages will become apparent from the following detailed description when taken in conjunction with the drawings, in which:

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
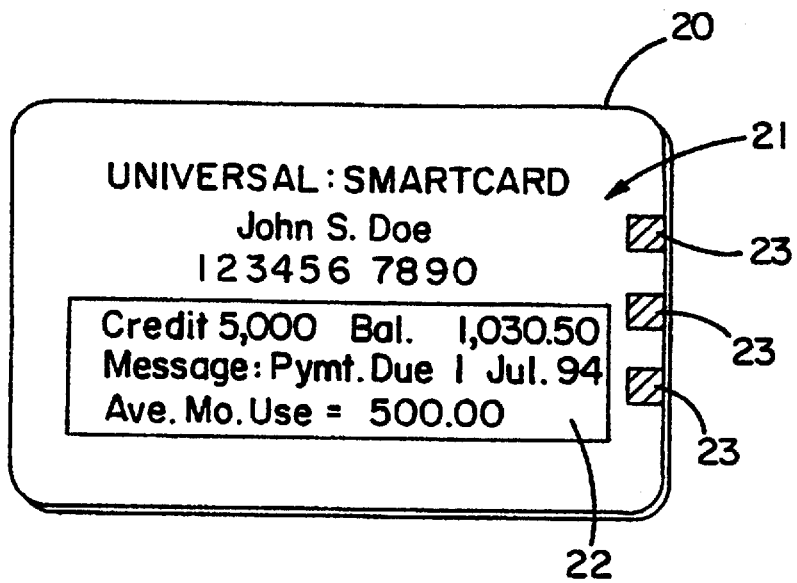
FIG. 1 is a drawing illustrating the use of a display according to the present invention in connection with a wallet-size electronic data card.

Turning now to the drawings, FIG. 1 shows the application of the present invention to an electronic data card having an integral display. The card 20 is in the shape of a conventional credit card, and is a wallet-sized device. The surface thereof can be imprinted as at 21 with identifying indicia. In accordance with the invention, the surface of the card 20 also carries a display area 22 which can be used to display relevant information to the card holder. For example, when the card is a debit card, the information displayed can relate to the balances of the account in question. If the data card is a health card of the type for storing health-related information, the display can be operated to display various information such as family doctor name, blood type, etc. These suggested applications are only exemplary; the capabilities provided by an on-board inexpensive display will ultimately suggest numerous additional uses to those skilled in this art.

Figure 2:
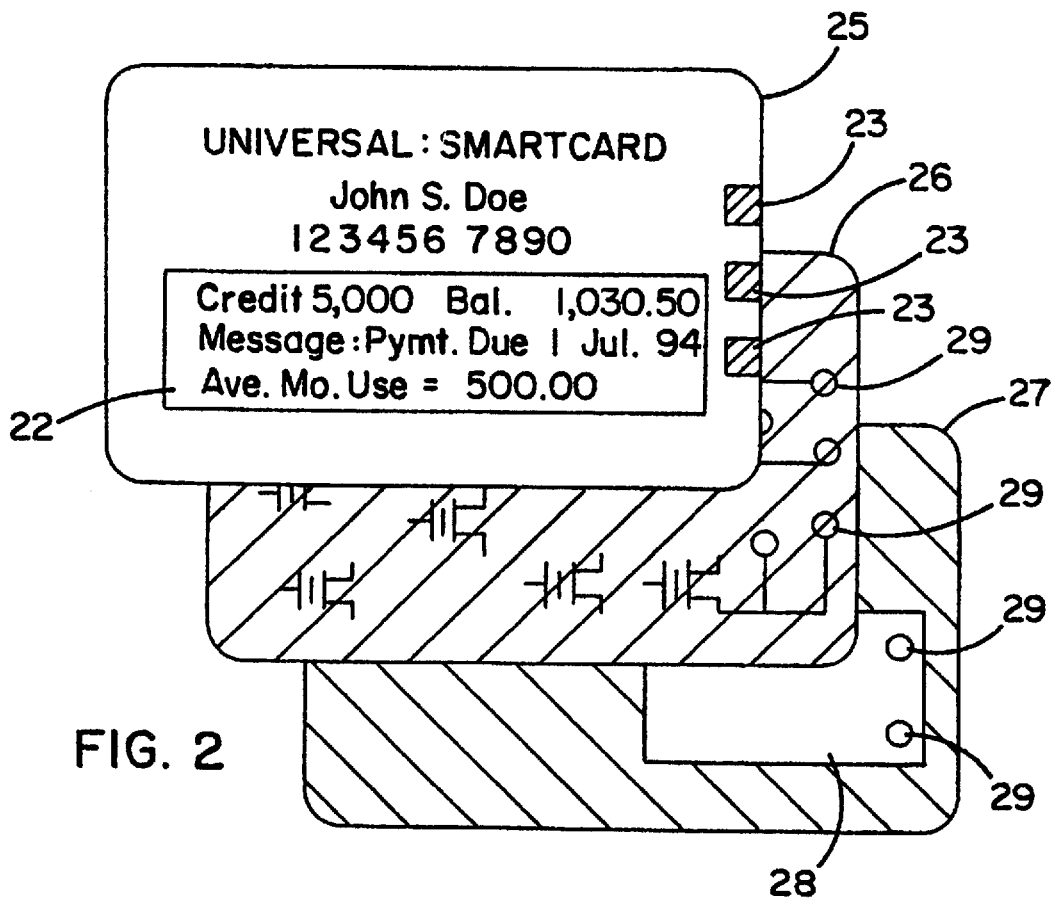
FIG. 2 illustrates the electronic data card of FIG. 1 and its laminated configuration.

The credit card components are better illustrated in FIG. 2 which shows three layers 25, 26, 27 which are laminated together to form the credit card 20 of FIG. 1. An intermediate layer 26 carries thin film transistor circuitry for storing information and for driving the display. Concurrently filed copending application Ser. No. 08/319,752, assigned to the same assignee as the present invention (Docket 59937), discloses a thin film transistor on insulator structure which utilizes floating gate thin film transistors for storing information, and which provides the ability to interconnect a large number of storage and switching transistors on a single layer 26 to provide the capacity and capability for storage and access of information in a data card. The thin film transistor layer 26 is configured in accordance with the disclosure of the foregoing application, and to the extent necessary, the disclosure of said copending application is incorporated herein by reference. A plurality of layers 26 can also be laminated together for more extensive storage or processing capacity.

In accordance with the present invention, in addition to the thin film transistor circuitry in the card, an electronic display associated with additional thin film transistor circuitry is provided which, like the thin film transistor storage circuitry can be formed on an insulating flexible non-planar substrate. FIG. 2 shows the display as being carried by the upper layer 25 of the laminated card. In some applications, it will be desirable to form the display on an intermediate layer 26, and simply leave a clear window on the layer 25 overlying the display area of the layer 26. When the display is formed on a different layer than the storage and driving transistors, interconnections between the layers 25, 26 by way of vias are required. For purposes of powering the display, a battery 28 is provided. In the illustrated embodiment, the battery 28 is associated with the lower level 27 and is connected to the driving electronics on the layer 26 and the display electronics on the layer 25 by means of vias 29.

Electrical contacts 23 are provided for connection to the on-board circuitry, and represent a broader range of means for connecting the card 20 to a terminal or reader which will be useful in the typical application employing the card. There will be cases, of course, where the card, once programmed, will function independently of a reader or terminal, and the interconnection means 23 can then be made less accessible since it will be used primarily on initial programming.

Figure 3:
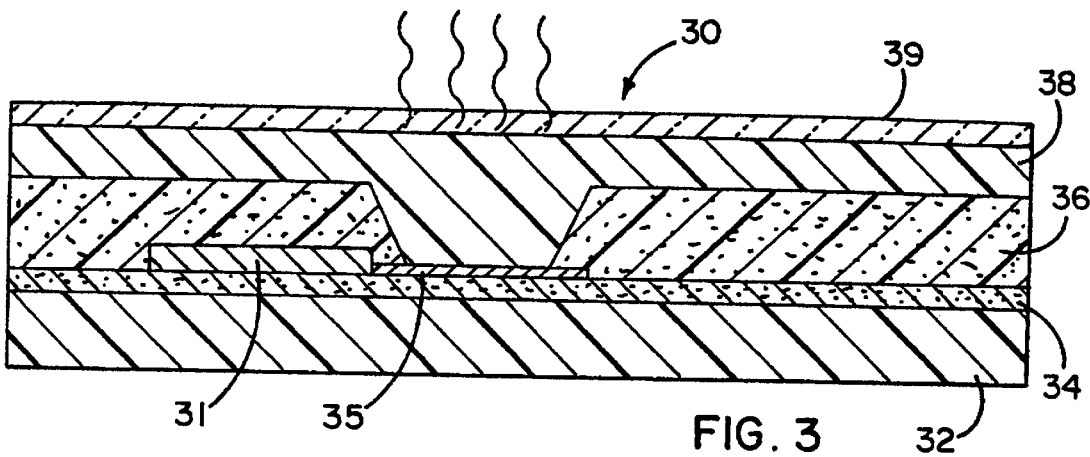
FIG. 3 is a cross-sectional representation of a single display pixel constructed in accordance with the present invention.

In accordance with the invention, the display area and similar display areas in other applications, are configured as a pixelized space constructed as illustrated in FIG. 3. There is shown in greatly enlarged form, and with the respective sections drawn not to scale, a portion of a display, such as display 22, representing a single pixel. The pixel will typically be square, and the majority of the pixel area will be occupied by the actual light-emitting means shown generally at 30. Also disposed directly in the pixel area is a transistor driver 31. Both the driver 31 and the light-emitting means 30 are carried by an insulating substrate 32. The relative proportions of the driving transistor 31 and light-emitting means 30 are not to scale, since if they were drawn to scale, it would not be possible to appreciate the presence and significance of the transistor 31. In a typical implementation, the area ratio between the light-emitting means 30 and the driving transistor 31 will be on the order of 100:1. It will thus be appreciated that the vast majority of the pixel is typically a light emitter, and only a minority of the area is reserved for driving electronics and the like.

Turning to FIG. 3 in greater detail, it will be appreciated that the single pixel shown there is a small portion of a much larger display area. All pixels are formed on a non-planar insulating substrate, which may be curved or flexible. It is of course possible to form the device on a rigid substrate, in cases where the flexibility and size advantages of the invention are not required. However, in many cases, such as for visors, for data cards and the like, the substrate 32 is preferably a polyimide film. A first layer metallization 34 is deposited on the insulating substrate. The metallization is patterned to form lower metallization for the semiconductor 31, and lower metal interconnections between the output of the semiconductor device and the input of a lower electrode 35 of the light-emitting means. The electrode 35 is deposited over the metallization layer 34 after the metallization layer is patterned. The electrode 35 is deposited in such a way that it has a metallic connection to the output of the driver electronics 31, but no shorting connections to the remainder of the metallic layer 34. Thus, a passivating layer can be put in place or alternatively the pattern for the lower metallization 34 can provide a large open space on which the electrode 35 is to be deposited. After formation of the semiconductor driver 31 and the electrode 35, the device is covered by a passivating insulator layer 36, such as silicon dioxide. The insulating layer 36 is patterned to expose most of the area of the underlying electrode 35, but to protect the semiconductor driver 31 and to form a small margin around the edges of the pixel. It is emphasized at this point that the relative proportions of FIG. 3 do not represent the actual proportions, since the drawing is made to illustrate (and for that reason overemphasizes) the structure at the margin. After the insulator layer 36 is formed and patterned, a layer of light-emitting polymer 38 is then deposited. The light-emitting polymer is taken from the group of polymers based on PPA or PPV. The PPA polymers are poly(p-phenylene acetylene). Reference is made to commonly owned Shinar et al. U.S. Pat. No. 5,334,539 for a disclosure of such polymers. When using the PPA polymers, it is preferred to configure the lower electrode 35 of low work function material, i.e., with a work function no greater than about 4.5 eV. Conveniently, the electrode layer 35 is of aluminum which has a low work function, and is readily sputtered and patterned to form the electrode 35.

As noted above, the light-emitting (electroluminescent) polymer 38 can also be any of a number of available PPV poly(p-phenylene vinylene) materials. In either case, the electroluminescent polymer is sandwiched between a pair of electrodes for injecting carriers and causing the polymer to emit light.

The light-emitting polymer 38 is deposited by conventional coating techniques, such as spin coating. Following deposition of the polymer layer 38, an upper electrode 39, preferably translucent, is deposited on the upper surface of the polymer layer. Preferably, the upper electrode is an indium tin oxide (ITO) which is capable of injecting holes into the polymer layer. After deposition of the ITO electrode 39, the device is annealed according to the requirements of the polymer layer 38. Preferably, and with PPA based polymers, the device is annealed at a temperature of about 100° C. to 250° C., more preferably about 120° C. to 200° C., and most preferably at a temperature of about 150° C. to 200° C. Annealing usually requires a time in a range between about 2 to 4 hours. Preferably, the annealing is carried out under a substantially oxygen-free environment, such as under a nitrogen or argon atmosphere. It should be kept in mind that annealing temperatures are preferably limited to this relatively low range of processing temperatures, since those temperatures are also compatible with the polyimide substrate 32 and the thin film transistor drivers 31.

Although not shown in FIG. 3, the transistor driver 31 has interconnections to interface circuitry which is generally located in a remote, non-pixel area of the display. One or more conductors (typically a row and a column conductor), will be routed to the driver, and when both conductors are active, the driver will conduct current to the electrode 35. In the configuration described thus far, the electrode 35 will be driven negatively so as to inject electrons into the polymer layer 38. The ITO transparent electrode will typically be continuous and will be biased positively (to inject holes) into the polymer. Under those conditions, the polymer will emit light in all of the pixels in which the driver 31 has the electrode 35 biased negatively.

It is noted that in some cases it will be useful to bias the electroluminescent polymer with a negative electrode on the face, and positive selector drive from the pixel driver 31. It will be apparent to those skilled in the art, after a discussion of the structure of the pixel driver 31, that only minor changes will be required to invert the polarity of the driver.

Figure 4:
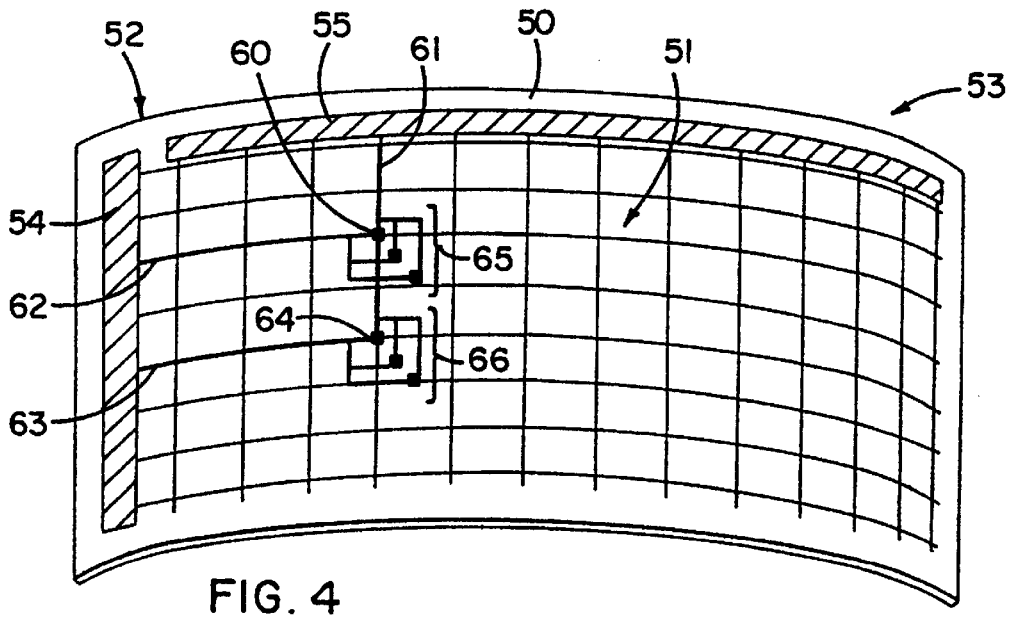
FIG. 4 illustrates a curved display using a large plurality of pixels constructed in accordance with the present invention.

Turning then to FIG. 4, there is illustrated a curved display constructed in accordance with the present invention. The description of FIG. 4 will also apply in most respects to a flat display. The curved display is selected for illustration because the ability to produce such a curved (or flexible) display is uniquely satisfied by the present invention. The display of FIG. 4 is based on a flexible substrate 50, typically a polyimide sheet. It is seen that the display 50 has the major central portion thereof 51 divided into pixels and dedicated to display. Two margins of the substrate 52, 53 provide space for interface electronics. The cross-hatched section 54 represents row driver interface electronics and the cross-hatched section 55 along the upper portion represents column driver interface electronics. It is seen that a plurality of row and column lines emanate from the respective drivers 54, 55 to form a grid-like structure. It will be appreciated by those skilled in the art that the grid is much finer than that illustrated in the drawings, although the drawing adequately conveys the idea. At each intersection of a row and column is located a pixel (such as the pixel illustrated in FIG. 3). One of such pixels is identified by the reference numeral 60. It is seen to be located at the intersection of column conductor 61 and row conductor 62. When the interfaces 54, 55 drive both of such conductors active, the electronic driver 31 in the pixel 60 is energized to provide a bias voltage on the associated electrode 35. Since the screen face electrode 39 is also biased, the polymer in the pixel 60 will emit light. The pixel will thereby be illuminated. Similarly, the pixel 64 is connected to the same column driver 61 but to a different row driver 63. In the illustrated conditions, even though the column driver 61 is activated, since the row driver 63 is not, the pixel 64 will not be illuminated. Those types of electrical decisions are made for each pixel of the screen either on a continuous scanning basis or on an update basis all as determined by the driving electronics.

In the case of a color display, the pixels are formed in triads generally bracketed at 65, 66. In this case, each pixel will be made up of a red pixel component, a blue pixel component, and a green pixel component. It is conventional to treat each of the red, blue and green components as individual pixels for separate driving. The diagram of FIG. 4, however, shows an association between such pixels, and adequate information can be carried on the row and column drivers to make electrical decisions on the illumination of the three components. Alternatively, individual rows and columns can be provided for each of the colors in the triad.

The interface electronics 54, 55 is also preferably formed of thin film transistor technology deposited directly on the substrate 50. The interface electronics will typically include memory as well as drivers, with the drivers being energized under the control of the memory to bring row lines or column lines high or low, depending on the information intended to strobe into any pixel at any given time in the scan sequence.

Figure 5:
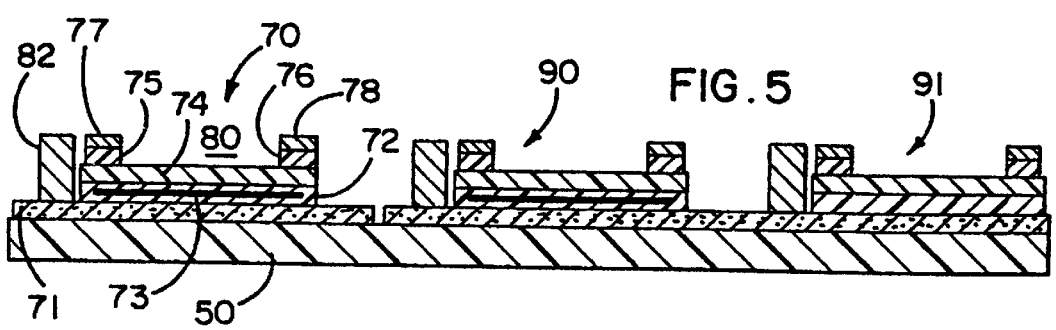
FIG. 5 better illustrates the driving electronics for the rows and columns of the display of FIG. 4.

FIG. 5 better represents the nature of the thin film transistors which are utilized for the interface circuits 54, 55, as well as for the pixel driver 31. First of all, it will be seen that all of the transistors in FIG. 5 are formed on the insulating substrate 50. A lower metallization layer 71 is deposited on the substrate 50 and is patterned, typically to form control gate metallization and interconnects for the control gate metallization. Deposited over the patterned lower metallization is a dielectric layer 72. The dielectric layer 72, in the case of leftmost transistor 70, encapsulates a floating gate 73. The floating gate provides a storage capacity to the thin film transistor. The dielectric layer 72 is preferably a two-component layer, with a lower component comprising silicon dioxide encapsulating the floating gate, and an upper component comprising silicon nitride which interfaces with the semiconductor layer. The semiconductor layer 72, deposited directly over the dielectric layer 72, is α-Si:H layer. The layer is formed and patterned with source and drain regions 75, 76. The source and drain regions are preferably N+ doped α-Si:H, formed in the last phase of the deposition of the semiconductor layer 74 by the introduction of a dopant for the final few minutes of the amorphous silicon layer deposition. After formation of the layer, chromium contacts 77, 78 are formed in place on the doped amorphous silicon layer, patterned for formation of a self-aligned gate, and the device then etched down to the intrinsic amorphous silicon layer 74, thereby forming a channel region 80 between the source and drain 75, 76. A via 82 provides a contact at the upper surface of the semiconductor material with the lower metallization 71 and thus to the control gate of the floating gate transistor 70.

The floating gate transistor 70 functions as a memory element which is programmed in a known way by applying programming voltages to the gate, source and drain which either store an electrical charge on the floating gate or remove a previously stored electrical charge from the floating gate. The presence or absence of a charge on the floating gate controls the threshold characteristic of the transistor. Thus, the memory cell can be read out by applying read voltages to the gate and determining the state of conduction of the floating gate transistor. If the floating gate transistor remains substantially non-conductive, that is an indication that an electrical charge stored on the floating gate represents a first logic state. If, on the other hand, the transistor is conductive when a read bias is applied, that is an indication that there is no stored charge on the floating gate and the opposite logic state has been stored. The remaining portion of FIG. 5 shows a floating gate thin film transistor interconnected with an ordinary thin film transistor which serves as a driver. The floating gate transistor is identified by reference numeral 90, and the switching thin film transistor by the reference numeral 91. All of the transistors are formed at the same time and have the same layers and structure, with the exception that during the deposition of the floating gate metal layer such as 73, no metal is deposited in the transistor 91, so no floating gate is formed. The remaining layers are formed at the same time and are identical for each device. The driver transistor 91 functions as a normal field effect transistor wherein the voltage impressed on the gate (by way of the lower metallization) controls conduction between the source and the drain.

It is noted that the individual transistors 70, 90, 91 are formed with trenches therebetween such that leakage and interference between the devices is minimized. The break in the lower metallization between the transistor 70 and the pair 90, 91 indicate that the transistors might be separately used. The memory transistor 70 can be used in a small section of interface memory associated with the drivers 54 and 55. The combination of memory and driver transistor 90, 91 is typically used in the interface electronics 54, 55 for controlling each column line and each row line.

Finally, it will be noted that the driver transistor 91 shows the structure of the transistor driver 31 which is formed in each pixel in the display area. When using 2 micron technology, for example, the transistor 91 can be formed such that it covers only about 200 square microns of substrate area, and thus takes very little of the total pixel space. The length of the gate, and the length-to-width ratio are configured to provide adequate drive capacity for the diode-like structure represented by the polymer and its encasing electrodes. Thus, the gate length will be a function of the particular polymer used, but it is well within the skill of the art based on this disclosure for one to determine the appropriate gate length.

The drive electronics in the row and column drivers 54, 55 can be configured with or without memory, as desired. Conventional drivers are configured without memory, and conventional drivers are operated to continuously refresh the display. By continuous refresh is meant the writing of information for each pixel on each scan of a relatively rapid scan rate. However, when utilizing memory devices with the driver, a non-continuous refresh approach can be used. In such an approach, the information for each pixel is stored in a memory cell (such as the floating gate transistor 90 in the row or column driver for each pixel), and the information in that floating gate memory cell is not updated until that portion of the display is to change. Thus, the row and column drivers can each be configured with memory devices such as the 90, 91 configuration, and continuous refresh scanning of the display can be eliminated. In either case, the row and column drivers will be driven by driver transistors such as transistor 91, and the signals will be decoded by the pixel located driver in each of the pixels. With a continuous refresh operation, the driver transistors and the row and column drivers will be serviced during each scan of the display. With a non-continuous refresh operation, the associated memory cells will only be altered when that section of the display is to be changed.

It will now be appreciated that what has been provided is a display having a display area which provides capabilities not typically available heretofore. The display area has first of all an electroluminescent light-emitting means comprising a light-emitting polymer sandwiched between driving electrodes. Each pixel also includes a driver transistor formed in thin film technology and connected directly to one of the driving electrodes for the light-emitting means. The driving transistor in turn can respond to (or decode) row and column instructions, thereby minimizing the quantity of electronics and the number of interconnections required for a display device.

The utilization of thin film electronics and light-emitting polymers allows the use of flexible substrates such as for visors and helmets and the like. It also allows for easy fabrication of curved displays. The curved display of FIG. 4 is substantially no more difficult to manufacture than a flat planar display when utilizing the thin film transistor technology with light-emitting polymer electroluminescent devices as described in the present application. Finally, the ability to flex the device without destruction leads to the provision of display-type data cards such as those illustrated in FIG. 1 and 2 in accordance with the present invention.

What is claimed is:

1. In a non-planar solid state electronic light-emitting display device, the combination comprising:

a non-planar substrate divided into a matrix of pixels;

an interconnect layer including row and column connections to the pixels;

each pixel including a thin film transistor driver/decoder and a light-emitting area;

each thin film transistor including decoding means connected to the interconnect layer for receiving signals for energizing the thin film transistor, the thin film transistor including a plurality of layers of silicon, dielectric and metallization configured to form a thin film transistor of sufficient current capacity to drive the associated light-emitting area;

each light-emitting area including a first electrode connected to the associated thin film transistor, a light-emitting polymer deposited on the first electrode and a transparent electrode overlying the light-emitting polymer, so that the respective electrodes, upon energization of the associated thin film transistor, inject carriers into the light-emitting polymer causing said polymer to illuminate the associated pixel;

whereby the coupling of electronic signals to the row and column connections provides for the selective illumination of pixels.

2. The combination as set forth in claim 1 wherein the light-emitting polymer is a PPA electroluminescent polymer, the first electrode comprising an aluminum electrode adapted to inject electrons into the polymer, and the transparent electrode overlying the light-emitting polymer comprising an ITO electrode adapted to inject holes into the polymer.

3. The combination as set forth in claim 1 wherein the light-emitting polymer is a PPV electroluminescent polymer, one of the electrodes adapted to inject electrons into the polymer, and the other electrode adapted to inject holes into the polymer.

4. The combination as set forth in claim 1 wherein the first electrode is an aluminum electrode occupying the majority of the area of the pixel, and the transparent electrode is an ITO electrode which covers a plurality of pixels.

5. The combination as set forth in claim 1 wherein the thin film transistor comprises a gate layer deposited on the substrate, a dielectric deposited on the gate layer, a silicon layer deposited on the dielectric layer and having doped source and drain regions at the surface thereof, and electrodes connected to the source, drain and gate of the thin film transistor for interconnecting said transistor with the interconnect layer and the first electrode.

6. The combination as set forth in claim 1 wherein the non-planar substrate is a flexible polyimide sheet.

7. The combination as set forth in claim 1 wherein the display device is formed in a data card including an on-board data memory electrically connected to the display device for display of information stored in said memory, the data card being a wallet-sized card of laminated plastic construction.

8. The combination as set forth in claim 5 wherein the silicon layer deposited on the dielectric layer is amorphous silicon.

9. The combination as set forth in claim 8 wherein said amorphous silicon layer is $\alpha$-Si:H.

* * * * *